(12) United States Patent
Bernstein et al.

(10) Patent No.: US 11,770,114 B2
(45) Date of Patent: *Sep. 26, 2023

(54) SUBBAND ADAPTIVE FILTER FOR SYSTEMS WITH PARTIALLY ACAUSAL TRANSFER FUNCTIONS

(71) Applicant: Bose Corporation, Framingham, MA (US)

(72) Inventors: Eric Raczka Bernstein, Cambridge, MA (US); Wade P. Torres, Attleboro, MA (US); Ankita D. Jain, Westborough, MA (US)

(73) Assignee: Bose Corporation, Framingham, MA (US)

( * ) Notice: Subject to any disclaimer, the term of this patent is extended or adjusted under 35 U.S.C. 154(b) by 49 days.

This patent is subject to a terminal disclaimer.

(21) Appl. No.: 17/168,676

(22) Filed: Feb. 5, 2021

(65) Prior Publication Data
US 2021/0167757 A1 Jun. 3, 2021

Related U.S. Application Data

(63) Continuation of application No. 16/369,897, filed on Mar. 29, 2019, now Pat. No. 10,917,074.

(51) Int. Cl.
*H03H 21/00* (2006.01)
*G10K 11/178* (2006.01)
*H04R 3/00* (2006.01)

(52) U.S. Cl.
CPC ... *H03H 21/0012* (2013.01); *G10K 11/17817* (2018.01); *H04R 3/005* (2013.01); *H03H 2021/0078* (2013.01)

(58) Field of Classification Search
CPC ....... G10K 11/17817; G10K 11/17854; G10K 11/17881; G10K 2210/3028;
(Continued)

(56) References Cited

U.S. PATENT DOCUMENTS 5,001,701 A 3/1991 Gay
5,329,587 A 7/1994 Morgan
(Continued)

FOREIGN PATENT DOCUMENTS

CN 1162869 10/1997
CN 101083640 12/2007
(Continued)

OTHER PUBLICATIONS

Courville et al., "Adaptive filtering in subbands using a weighted criterion," IEEE Transactions on Signal Processing, 1998, 46(9):2367.
(Continued)

*Primary Examiner* — Lun-See Lao
(74) *Attorney, Agent, or Firm* — Fish & Richardson P.C.

(57) ABSTRACT

A noise reduction system includes sensors configured to generate an input signal, an adaptive filter configured to represent a transfer function of a path traversed by the input signal, one or more processing devices, and one or more transducers. The processing devices receive the input signal and generate an updated set of filter coefficients of the adaptive filter by separating the input signal into frequency subbands; determining for each subband, coefficients of a corresponding subband adaptive module; and combining the coefficients of multiple subband adaptive modules. Determining the coefficients of the corresponding subband adaptive module includes selecting a subset of a precomputed set of filter coefficients of the adaptive filter. The processing devices process a portion of the input signal using the updated set of filter coefficients of the adaptive filter to generate an output that destructively interferes with another signal traversing the path represented by the transfer function.

18 Claims, 10 Drawing Sheets

(58) Field of Classification Search
CPC .... G10K 2210/3051; G10K 2210/3055; G10L 21/02; H04R 3/005; H04M 3/002; H04M 3/567; H04M 3/568; H04M 9/082; H04N 19/124; H04N 19/63; H04N 19/96
USPC ............ 381/71.1–71.6, 71.11–71.14; 700/94
See application file for complete search history.

(56) References Cited

U.S. PATENT DOCUMENTS

| | | | |
|---|---|---|---|
| 5,721,772 A | | 2/1998 | Haneda et al. |
| 5,859,914 A | | 1/1999 | Ono et al. |
| 5,970,154 A | | 10/1999 | Chen |
| 6,396,872 B1 | | 5/2002 | Sugiyama |
| 7,656,945 B1 * | | 2/2010 | Warner ............. H04L 25/03038 455/182.2 |
| 8,280,065 B2 * | | 10/2012 | Nadjar ............. G10K 11/17825 381/71.8 |
| 9,704,471 B1 * | | 7/2017 | Ku .................... G10K 11/17854 |
| 10,917,074 B2 * | | 2/2021 | Bernstein ............... H04R 3/005 |
| 2001/0054974 A1 | | 12/2001 | Wright |
| 2004/0015529 A1 * | | 1/2004 | Tanrikulu ................. H04B 3/23 708/322 |
| 2006/0095488 A1 | | 5/2006 | Pietrowicz |
| 2008/0273728 A1 * | | 11/2008 | Tjalfe Klinkby .... H04R 25/453 381/318 |
| 2009/0086986 A1 | | 4/2009 | Schmidt et al. |
| 2010/0284546 A1 | | 11/2010 | DeBrunner et al. |
| 2011/0216807 A1 | | 9/2011 | Christoph |
| 2012/0308029 A1 | | 12/2012 | Christoph |
| 2016/0127684 A1 * | | 5/2016 | Hanson .................. G06Q 30/01 348/14.08 |
| 2017/0178617 A1 | | 6/2017 | Christoph et al. |
| 2018/0141363 A1 * | | 5/2018 | Pandey .................... H04B 3/23 |
| 2018/0145725 A1 * | | 5/2018 | Pandey .................. H04B 3/232 |
| 2018/0240452 A1 | | 8/2018 | Every et al. |
| 2020/0313655 A1 | | 10/2020 | Bernstein et al. |

FOREIGN PATENT DOCUMENTS

| | | |
|---|---|---|
| CN | 101411063 | 4/2009 |
| CN | 101557372 | 10/2009 |
| CN | 102195616 | 9/2011 |
| CN | 102859591 | 1/2013 |
| CN | 105531928 | 4/2016 |
| EP | 0615340 | 9/1994 |
| EP | 0769867 | 4/1997 |
| EP | 2682941 | 1/2014 |
| WO | WO 2011/129725 | 10/2011 |

OTHER PUBLICATIONS

International Search Report and written Opinion in International Appln. No. PCT/US2020/025314, dated Jul. 31, 2020, 16 pages.
Morgan et al., "A delay less subband adaptive filter architecture," IEEE Transactions on Signal Processing, 1995, 43(8):1819-1830.
De Courville et al., "Adaptive Filtering in Subbands Using a Weighted Criterion," IEEE Transactions on Signal Processing, Sep. 1, 1998, 46(9):2359-2371.
Gilloire et al., "Adaptive Filtering in Subbands with Critical Sampling: Analysis, Experiments, and Application to Acoustic Echo Cancellation," IEEE Transactions on Signal Processing, Aug. 31, 1992, 40(8):1869-1875.
Liu, "Active Noise Control Technique Based on Adaptive Filtering and Modal Analysis," The Full Text of Chinese Doctoral Dissertations, Dec. 15, 2014, 100 pages (abstract only).
Pradhan et al., "A New Approach to Subband Adaptive Filtering," IEEE Transactions on Signal Processing, Mar. 3, 1999, 47(3):655-664.

* cited by examiner

SUBBAND ADAPTIVE FILTER FOR SYSTEMS WITH PARTIALLY ACAUSAL TRANSFER FUNCTIONS

CLAIM OF PRIORITY

This application is a continuation of U.S. patent application Ser. No. 16/369,897, filed on Mar. 29, 2019, the entire contents of which are hereby incorporated by reference.

TECHNICAL FIELD

This disclosure generally relates to estimating coefficients of an adaptive filter, for example, to perform acoustic noise cancellation. Adaptive filters, including subband adaptive filters, can generate acoustic outputs configured to destructively interfere with a noise signal, e.g. to reduce the noise perceived by a user in a moving vehicle.

BACKGROUND

The perceived quality of music or speech in an environment may be degraded by variable acoustic noise present in the environment. For example, when the environment is a moving vehicle, noise may result from, and be dependent upon, vehicle speed, road condition, weather, and condition of the vehicle. The presence of noise may hide soft sounds of interest and lessen the fidelity of music or the intelligibility of speech.

SUMMARY

This document describes technology that mitigates the chances of instability in a subband adaptive filter system in response to receiving a noise signal that contributes to acausal components in the plant model. An inverse stacking process, described in further detail herein, corrects for coefficients of the subband adaptive filter system that correspond to acausal components of the plant model. The technique described can enable the subband adaptive filter system to adapt at a decimated rate, reducing a computational load of the subband adaptive filter system. The technique described can also enable selective activation or deactivation of certain frequency bands in order to limit performance of the subband adaptive filter system to specific bands of interest without risking artifacts that may affect the overall system performance outside of a target frequency range.

In one aspect, a method for estimating coefficients of an adaptive filter includes receiving an input signal at one or more processing devices and generating, based on the input signal, an updated set of filter coefficients of an adaptive system identification filter. The adaptive system identification filter is configured to represent a transfer function of a path traversed by the input signal. Generating the updated set of filter coefficients of the adaptive system identification filter includes (i) separating the input signal into multiple frequency subbands, (ii) determining, for each frequency subband, one or more coefficients of a corresponding subband adaptive module, and (iii) combining the one or more coefficients of multiple subband adaptive modules to generate the updated set of filter coefficients of the adaptive system identification filter. Determining the one or more coefficients of the corresponding subband adaptive module includes (a) obtaining a precomputed set of filter coefficients of the adaptive system identification filter, and (b) selecting a subset of the precomputed set of filter coefficients of the adaptive system identification filter. The method further includes processing a portion of the input signal using the updated set of filter coefficients of the adaptive system identification filter to generate an output that destructively interferes with another signal traversing the path represented by the transfer function.

Implementations may include one or more of the following features. The subset of the precomputed set of filter coefficients of the adaptive system identification filter can be selected to correspond to a causal relationship between the input signal and another signal traversing the path represented by the transfer function. The subset of the precomputed set of filter coefficients of the adaptive system identification filter can be selected to correspond to frequency bands within a target performance range, for example, between approximately 30-300 Hz. The input signal can be collected by one or more accelerometers and/or microphones. The one or more of the corresponding subband adaptive modules can be a least mean squares (LMS) module, a Filtered-X least mean squares (FXLMS) module, and/or a filtered error least mean squares (FELMS) module. Combining the one or more coefficients of the multiple subband adaptive modules can include transforming time domain representations of the one or more coefficients of the multiple subband adaptive modules into corresponding frequency domain representations; combining the corresponding frequency domain representations of the one or more coefficients of the multiple subband adaptive modules; and transforming the combined frequency domain representations into a time domain representation. In some implementations, determining the one or more coefficients of the corresponding subband adaptive module can further include computing, based on the subset, frequency domain representations of the precomputed set of filter coefficients of the adaptive system identification filter; separating the frequency domain representations into the multiple frequency subbands and computing a corresponding time domain representation for each; and generating the one or more coefficients of the subband adaptive module based on the corresponding time domain representation. In some implementations, the precomputed set of filter coefficients that are not selected can be adjusted to be substantially near zero.

In another aspect, a noise reduction system includes one or more sensors configured to generate an input signal; an adaptive system identification filter configured to represent a transfer function of a path traversed by the input signal; one or more processing devices; and one or more transducers. The one or more processing devices are configured to receive the input signal and generate, based on the input signal, an updated set of filter coefficients of the adaptive system identification system. Generating the updated set of filter coefficients of the adaptive system identification filter includes (i) separating the input signal into multiple frequency subbands, (ii) determining, for each frequency subband, one or more coefficients of a corresponding subband adaptive module, and (iii) combining the one or more coefficients of multiple subband adaptive modules to generate the updated set of filter coefficients of the adaptive system identification filter. Determining the one or more coefficients of the corresponding subband adaptive module includes (a) obtaining a precomputed set of filter coefficients of the adaptive system identification filter, and (b) selecting a subset of the precomputed set of filter coefficients of the adaptive system identification filter. The one or more processing devices are further configured to process a portion of the input signal using the updated set of filter coefficients of the adaptive system identification filter to generate an output that destructively interferes with another signal traversing the path represented by the transfer function. The one or more transducers of the noise reduction system are driven by the output generated by the one or more processing devices.

Implementations may include one or more of the following features. The subset of the precomputed set of filter coefficients of the adaptive system identification filter can be selected to correspond to a causal relationship between the input signal and another signal traversing the path represented by the transfer function. The subset of the precomputed set of filter coefficients of the adaptive system identification filter can be selected to correspond to frequency bands within a target performance range, for example, between approximately 30-300 Hz. The input signal can be collected by one or more accelerometers and/or microphones. The one or more of the corresponding subband adaptive modules can be a least mean squares (LMS) module, a Filtered-X least mean squares (FXLMS) module, and/or a filtered error least mean squares (FELMS) module. Combining the one or more coefficients of the multiple subband adaptive modules can include transforming time domain representations of the one or more coefficients of the multiple subband adaptive modules into corresponding frequency domain representations; combining the corresponding frequency domain representations of the one or more coefficients of the multiple subband adaptive modules; and transforming the combined frequency domain representations into a time domain representation. In some implementations, determining the one or more coefficients of the corresponding subband adaptive module can further include computing, based on the subset, frequency domain representations of the precomputed set of filter coefficients of the adaptive system identification filter; separating the frequency domain representations into the multiple frequency subbands and computing a corresponding time domain representation for each; and generating the one or more coefficients of the subband adaptive module based on the corresponding time domain representation. In some implementations, the precomputed set of filter coefficients that are not selected can be adjusted to be substantially near zero.

In another aspect, one or more computer readable media store instructions that are executable by a processing device. Upon such execution, the instructions cause the processing device to perform operations that include receiving an input signal at one or more processing devices and generating, based on the input signal, an updated set of filter coefficients of an adaptive system identification filter. The adaptive system identification filter is configured to represent a transfer function of a path traversed by the input signal. Generating the updated set of filter coefficients of the adaptive system identification filter includes (i) separating the input signal into multiple frequency subbands, (ii) determining, for each frequency subband, one or more coefficients of a corresponding subband adaptive module, and (iii) combining the one or more coefficients of multiple subband adaptive modules to generate the updated set of filter coefficients of the adaptive system identification filter. Determining the one or more coefficients of the corresponding subband adaptive module includes (a) obtaining a precomputed set of filter coefficients of the adaptive system identification filter, and (b) selecting a subset of the precomputed set of filter coefficients of the adaptive system identification filter. The operations further include processing a portion of the input signal using the updated set of filter coefficients of the adaptive system identification filter to generate an output that destructively interferes with another signal traversing the path represented by the transfer function.

Implementations may include one or more of the following features. The subset of the precomputed set of filter coefficients of the adaptive system identification filter can be selected to correspond to a causal relationship between the input signal and another signal traversing the path represented by the transfer function. The subset of the precomputed set of filter coefficients of the adaptive system identification filter can be selected to correspond to frequency bands within a target performance range, for example, between approximately 30-300 Hz. The input signal can be collected by one or more accelerometers and/or microphones. The one or more of the corresponding subband adaptive modules can be a least mean squares (LMS) module, a Filtered-X least mean squares (FXLMS) module, and/or a filtered error least mean squares (FELMS) module. Combining the one or more coefficients of the multiple subband adaptive modules can include transforming time domain representations of the one or more coefficients of the multiple subband adaptive modules into corresponding frequency domain representations; combining the corresponding frequency domain representations of the one or more coefficients of the multiple subband adaptive modules; and transforming the combined frequency domain representations into a time domain representation. In some implementations, determining the one or more coefficients of the corresponding subband adaptive module can further include computing, based on the subset, frequency domain representations of the precomputed set of filter coefficients of the adaptive system identification filter; separating the frequency domain representations into the multiple frequency subbands and computing a corresponding time domain representation for each; and generating the one or more coefficients of the subband adaptive module based on the corresponding time domain representation. In some implementations, the precomputed set of filter coefficients that are not selected can be adjusted to be substantially near zero.

Two or more of the features described in this disclosure, including those described in this summary section, may be combined to form implementations not specifically described herein.

The details of one or more implementations are set forth in the accompanying drawings and the description below. Other features, objects, and advantages will be apparent from the description and drawings, and from the claims.

DETAILED DESCRIPTION

This document describes a subband adaptive filter that exhibits stable performance even in the presence of acausal components in the plant model. Plant models are commonly used in control theory to model signal paths, and are often represented using transfer functions. Existing subband adaptive filters often fail in the presence of acausal components because of uncontrolled growth of coefficients corresponding to the edges of each frequency subband. The technology described herein addresses the excessive growth of such coefficients by limiting the magnitude of the coefficients that correspond to acausal information included in the plant model. The technology described herein may provide further advantages including improved convergence rates and the performance of adaptation in select frequency bands of interest.

Adaptive system identification filters are digital filters having coefficients that can be dynamically adjusted to represent the transfer function of a given system. In this document, such adaptive system identification filters may be referred to as adaptive filters in shorthand. In some cases, adaptive filters are used to generate a signal that destructively interferes with another signal traversing the signal pathway represented by the transfer function of the system, thereby reducing the effects of the latter signal. For example, the generated signal can be configured to be substantially similar in magnitude, but of opposite phase with another signal such that a combination of the two signals produces a resulting waveform with decreased magnitude. One example of the use of adaptive filters is in the field of acoustic noise cancellation. In such cases, the generated signal destructively interferes with a noise signal such that a user perceives a reduced level of the undesired noise. While the adaptive filters disclosed herein are described in the context of acoustic noise cancellation, similar adaptive filters may be used for other applications without deviating from the scope of this disclosure.

Figure 1:
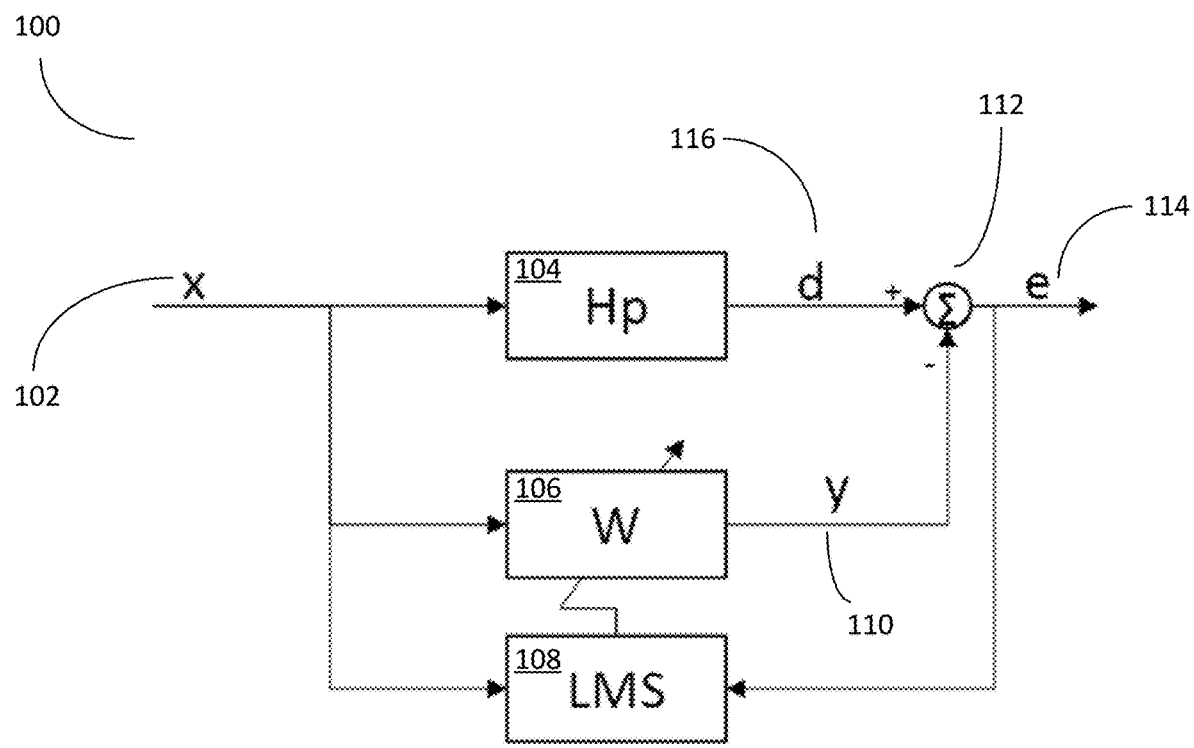
FIG. 1 is a block diagram showing an example wideband adaptive filter system.

FIG. 1 shows an example of a wideband adaptive filter system 100. The wideband adaptive filter system 100 receives an input signal (x) 102, which traverses a signal path (also referred to as a plant) 104 represented by a transfer function (Hp). The signal (d) 116 represents a modified version of the input signal 102 as processed by the signal path 104. In some cases, the signal 116 can be referred to as a target signal, an amplitude of which is sought to be reduced via destructive interference. For example, the input signal 102 can represent an acoustic noise signal such as road noise generated by a moving vehicle. The signal path 104 can represent the pathway of the input signal 102 to a passenger's ears, and the target signal 116 can therefore represent the resulting acoustic noise signal at the passenger's ears.

To reduce the effect of the signal 116, the filter system 100 further includes a wideband adaptive filter (W) 106, having filter taps with adjustable weights or coefficients. In some cases, the adaptive filter can be a finite impulse response (FIR) filter. The coefficients of the adaptive filter 106 are dynamically adjusted to approximate the transfer function corresponding to the signal path 104, as computed, for example, by an adaptation module 108. While the example of FIG. 1 shows the adaptation module 108 as a least mean square (LMS) module, other adaptation modules such as a filtered-X least mean squares (FXLMS) or filtered error least mean square (FELMS) may also be used. The adaptation module 108 receives the input signal 102 and an error signal 114 and updates the coefficients of the filter 106 to reduce the error signal 114. The updated coefficients of the filter 106 are used to process the input signal 102 to generate an output signal (y) 110. The generated output signal 110 is subtracted, for example at the adder 112, from the target signal 116 to update the error signal 114. In some cases, the output signal 110 can correspond to a control signal for one or more acoustic transducers such as speakers. In this way, the wideband adaptive filter system 100 is able to dynamically adjust the coefficients of the adaptive filter 106 to adaptively approximate the transfer function corresponding to the signal path 104. In a system such as the wideband adaptive filter system 100, a single adaptation module 108 operates over the entire sampling bandwidth.

Figure 2:
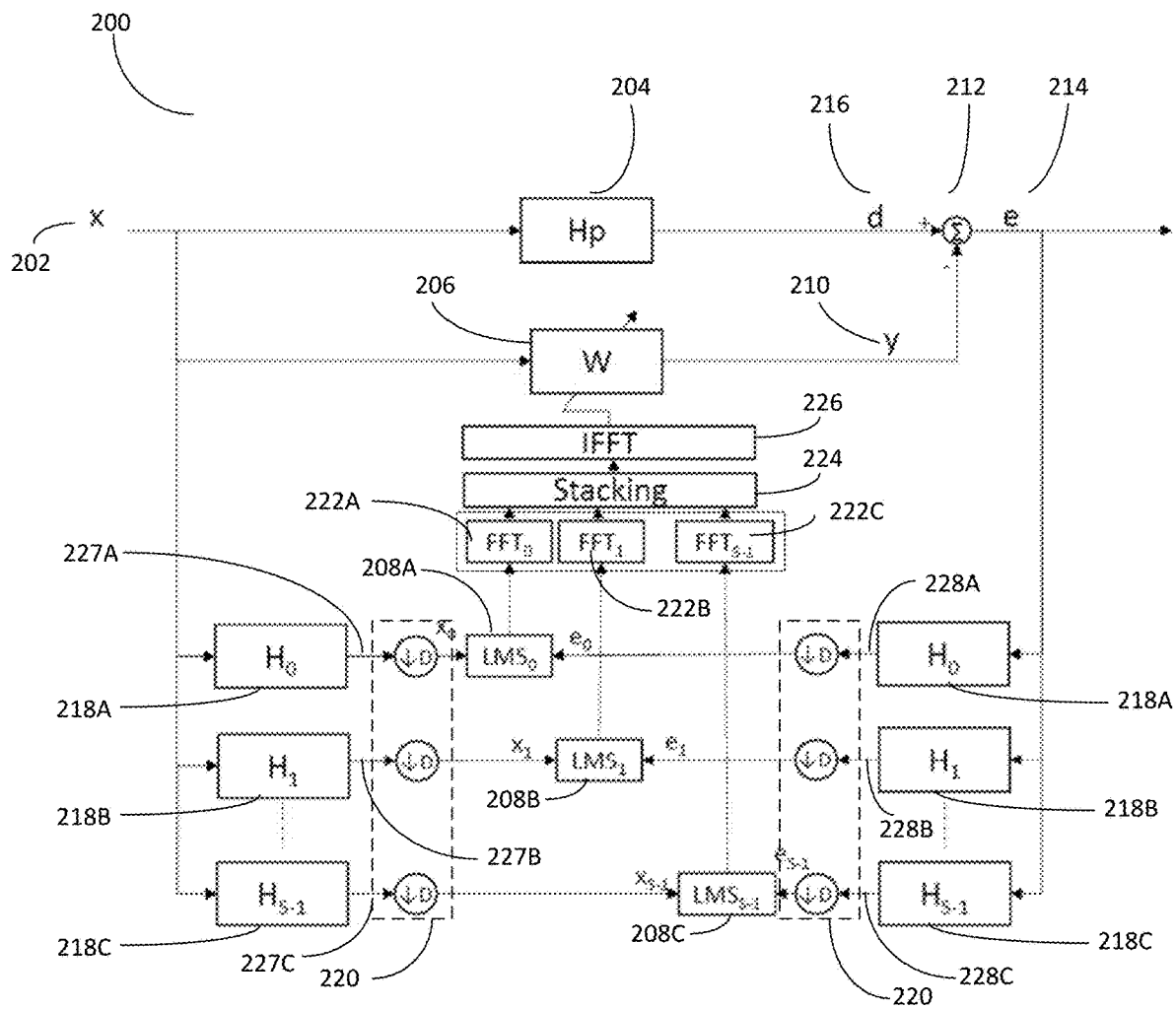
FIG. 2 is a block diagram showing an example subband adaptive filter system that includes multiple subband adaptive modules.

In contrast, a subband adaptive filter system uses multiple adaptive modules that each operate over a separate portion of the sampling bandwidth. FIG. 2 shows a subband adaptive filter system 200 with multiple LMS subband adaptive modules 208A-208C (208, in general). The subband adaptive filter system 200 shown in the example of FIG. 2 is a delayless subband system as disclosed in the publication: Morgan, D. and Thi, J., A Delayless Subband Adaptive Filter Architecture. IEEE Transactions on Signal Processing 43(8), 1995, the contents of which are incorporated herein by reference. The subband adaptive filter system 200 differs from the wideband system 100 of FIG. 1 in that the wideband coefficients for the adaptive filter 206 are determined by combining one or more coefficients computed by the multiple subband adaptive modules 208. The term subband, as used herein, refers to portions of a frequency band such as the sampling bandwidth.

Figure 3:
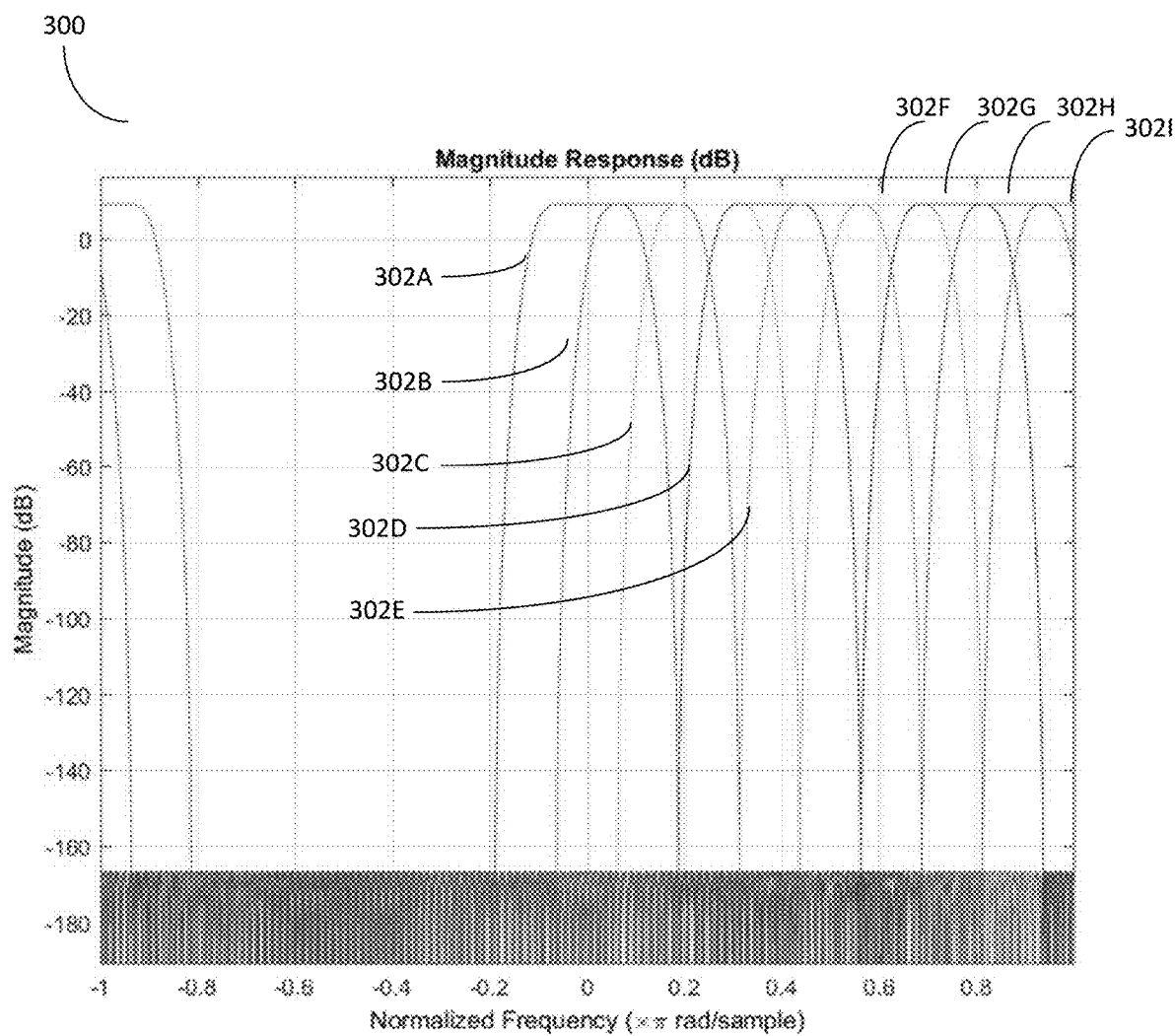
FIG. 3 is a graph showing an example of transfer functions for multiple analysis filters of the subband adaptive filter system shown in FIG. 2.

In the subband adaptive filter system 200, the input signal 202 and the error signal 214 are each split into multiple subbands, for example, through the use of multiple bandpass filters. As shown in FIG. 2, the input signal 202 and the error signal 214 are passed through a series of subband analysis filter banks ($H_0$-$H_{s-1}$) 218A-218C (218, in general) that each isolate a unique section of the complete frequency bandwidth of the signal. When the input signal 202 is passed through the series of subband analysis filter banks 218A-218C, the generated output is a series of subband filtered input signals 227A-227C (227, in general). When the error signal 214 is passed through the series of subband analysis filter banks 218A-218C, the generated output is a series of subband filtered error signals 228A-228C (228, in general). FIG. 3 is a graph 300 showing an example of the transfer functions 302A-302I (302, in general) for multiple analysis filters such as the analysis filters 218 of FIG. 2. As shown, the pass band of the transfer function 302 of each analysis filter 218 isolates a distinct frequency subband, and in combination, the multiple analysis filters are capable of capturing a wider bandwidth.

Referring back to FIG. 2, the subband filtered input signals 227 and subband filtered error signals 228 output by the transfer functions of the analysis filters 218 are each downsampled at a downsampling module 220 by a factor D. In some cases, the downsampling factor D is proportional to the total number of subbands of the subband adaptive filter system 200. In some cases, the sampling rate D can be selected such that the downsampled rate satisfies the Nyquist criterion for the corresponding portion of the bandpass signal, which may be referred to as critical sampling. In some implementations, the downsampled rate can be at least twice the corresponding Nyquist sampling rate; this is referred to as 2x oversampling. In some cases, the sampling rate may be the same or different for each subband of the subband adaptive filter system 200. The downsampled subband filtered input signals 227 and the downsampled subband filtered error signals 228 are then routed to the multiple subband adaptive modules 208A-208C (208, in general), with each subband adaptive module 208 computing a set of updated coefficients for the corresponding subband's frequency range. While the subband adaptive modules 208 are shown as LMS modules, other adaptation modules such as FXLMS or FELMS modules may also be used.

To combine the subband coefficients computed by the multiple subband adaptive modules 208 into a desired wideband adaptive filter 206, the coefficients for each subband are transformed to a frequency domain representation, for example, using Fast Fourier Transform (FFT) computed using corresponding transform modules 222A-222C (222, in general). In some cases, other frequency domain transformation techniques may be used in place of, or in conjunction with, FFT. Next, a stacking operation is performed using a stacking module 224, in which the frequency domain representations of the subband coefficients are assigned into appropriate bins of the overall wideband filter spectra. After completion of the stacking operation, an inverse transform module 226 computes an inverse transform (Inverse Fast Fourier Transform (IFFT), in this example) to obtain a set of wideband filter coefficients for the adaptive filter 206. The inverse transform module 226 computes an appropriate inverse transform in accordance with the transform computed by the transform module 222.

In some implementations, a subband adaptive filter system 200 may reduce computational burden, as compared to a wideband system, due to adapting at a decimated rate. In addition, improved convergence rates can be achieved due to each subband operating on a narrower bandwidth of the overall signal. In particular, a delayless subband design such as the subband adaptive filter system 200 avoids adding delay into the control path that could reduce performance. However, in some cases, the subband adaptive filter system 200 can exhibit unstable performance when disposed in conjunction with signal path 204 if the plant model includes acausal components, as described in further detail herein.

In some cases the transfer function corresponding to a signal path or plant model including exclusively acausal information can be referred to as an acausal transfer function. Likewise, the transfer function corresponding to a signal path or plant model including exclusively causal information can be referred to as a causal transfer function. In practice, transfer functions can include both causal and acausal components, and can be referred to as partially acausal transfer functions or partially causal transfer functions. In some cases, partially acausal transfer functions may be referred to as acausal transfer functions in shorthand.

The term causal information, as used in this document refers to information that contains leading features that are informative of at least some aspect of the values of a future signal, e.g., noise that is detected first within the input signal 202 and subsequently within the error signal 214. In contrast, the term acausal information, as used in this document, refers to information that contains no leading features that would allow a system to predict the values of a future signal, e.g., noise that is detected first within the error signal 214 and subsequently within the input signal 202. To demonstrate the performance characteristics of the subband adaptive filter system 200, two scenarios are analyzed—a strictly causal scenario and a strictly acausal scenario. While transfer functions can often include a combination of both causal and acausal components, this application describes the relevant concepts using impulse responses in strictly acausal and causal scenarios to better illustrate how the acausal components are handled.

In the first scenario, the target signal 216 is a five sample delay of the input signal 202. That is, there exists a causal relationship between the input signal 202 and the target signal 216, wherein the input signal 202 contains information that allows for the estimation of the transfer function 204 and resulting target signal 216. In this scenario, the transfer function 204 is a causal transfer function. In the second scenario, the target signal 216 is a five sample lead of the input signal 202. In this scenario, there is an acausal relationship between the input signal 202 and the target signal 216, and the transfer function 204 that relates them is an acausal transfer function. In other words, the information in the present and past samples of the input signal 202 is inadequate for generating weights of the causal adaptive filter 206 that reasonably approximate the transfer function 204 and generate an output signal 210 that reasonably approximates the target signal 216.

Figure 4A:
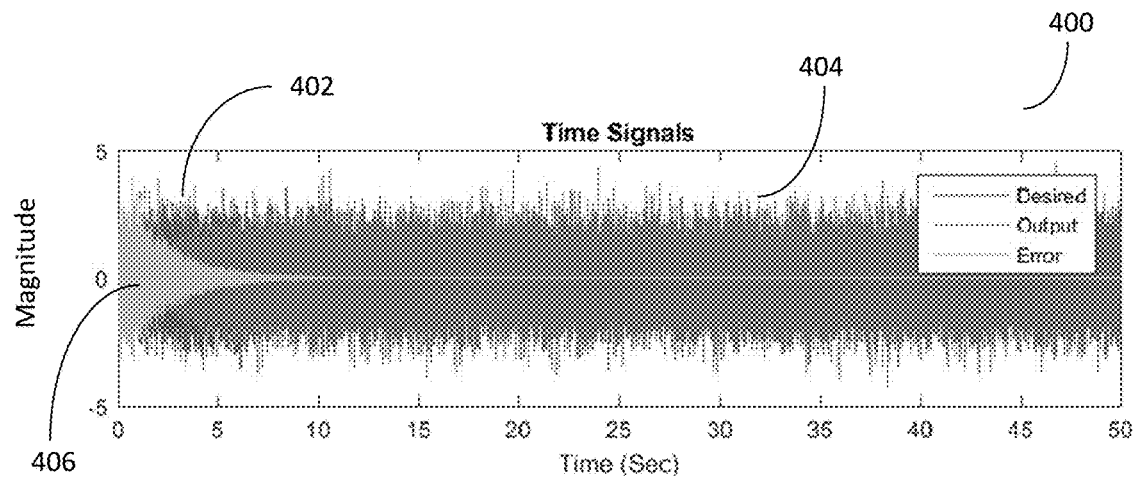
FIGS. 4A-4C are graphs showing the performance of the subband adaptive filter system of FIG. 2 when disposed in conjunction with a plant model that does not include acausal components.
Figure 4B:
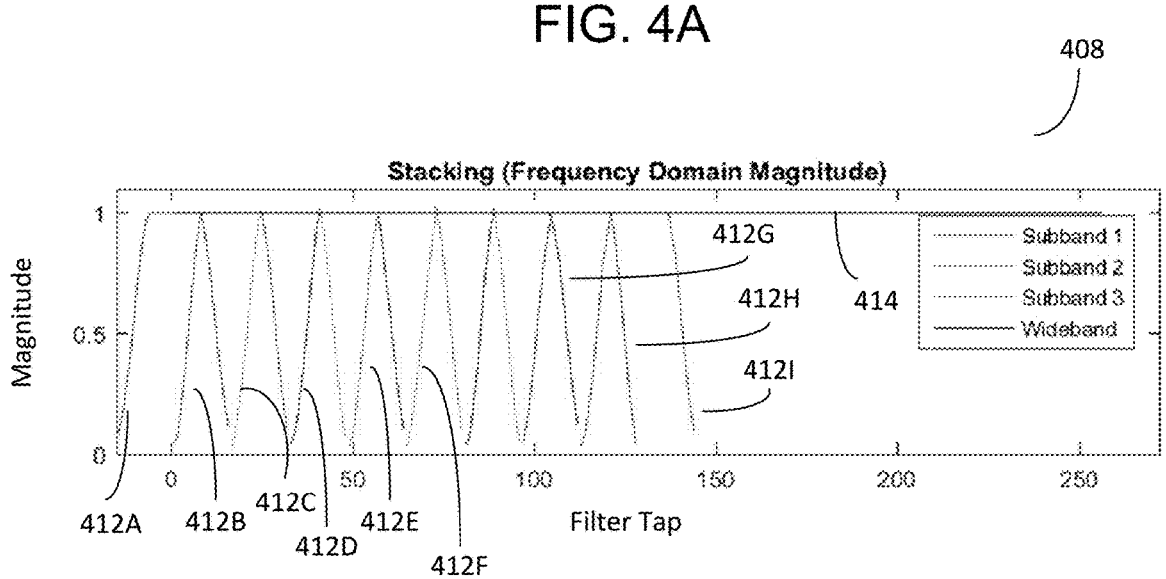
Figure 4C:
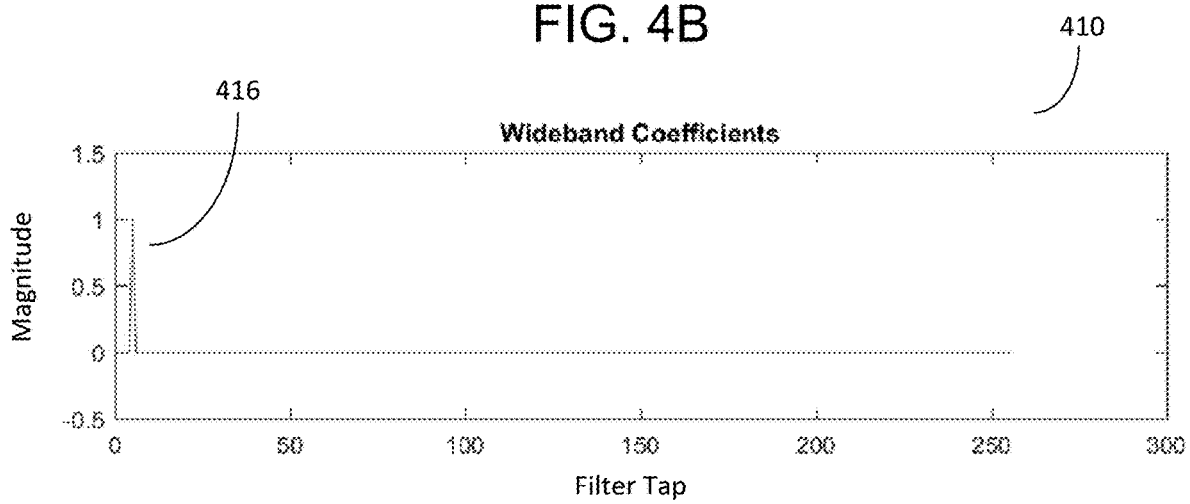

FIGS. 4A-4C show the performance of the subband adaptive filter system 200 in the causal scenario where the target signal 216 is the input signal 202 delayed by five samples. FIG. 4A is a graph 400 showing the time traces of the desired signal 402, the output signal 404, and the error signal 406. These time traces correspond to the target signal 216, the generated output signal 210, and the error signal 214 of FIG. 2 respectively. As evident from FIG. 4A, the subband adaptive filter system 200 was able to converge quickly to a set of coefficients that generated an output signal 210 reasonably approximating the target signal 216. This is manifested by the time trace of the error signal 406 decreasing over time to low values. FIG. 4B is a graph 408 showing plots 412A-412I (412, in general) of the frequency domain magnitudes of outputs generated by the corresponding transform modules 222 for the individual frequency subbands. Upon being stacked in the frequency domain, the frequency domain magnitudes of the overall wideband filter are represented by the plot 414. The filter coefficients for the overall wideband filter is obtained by computing an inverse transform of the values corresponding to the plot 414. FIG. 4C is a graph 410 showing the wideband filter coefficients determined by the subband adaptive filter system 200. As shown, the subband adaptive filter system 200 correctly generates an impulse 416 with a delay of five samples to approximate the plant transfer function 204. In the current example, 256 taps were used for the adaptive filter 206. While fewer taps could have been used for the causal scenario shown here, the high number of filter taps was selected for consistency in comparing performances in the causal and acausal scenarios.

Figure 5A:
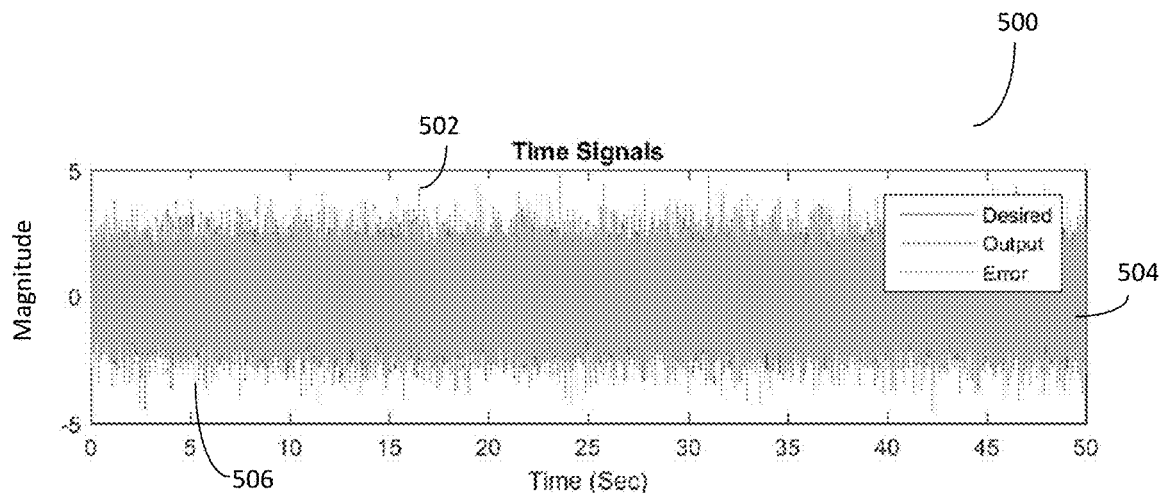
FIGS. 5A-5C are graphs showing the performance of the subband adaptive filter system of FIG. 2 when disposed in conjunction with a plant model that includes acausal components.
Figure 5B:
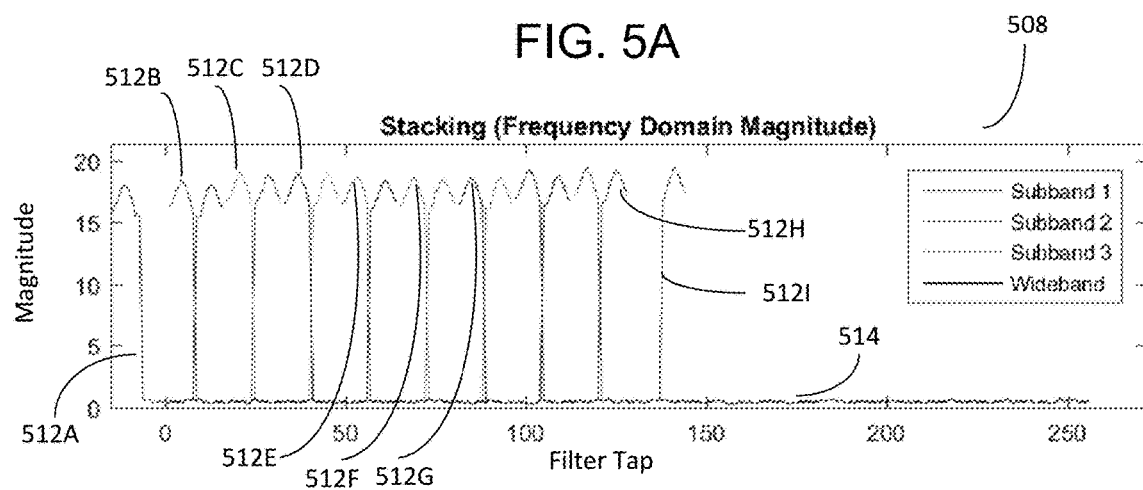
Figure 5C:
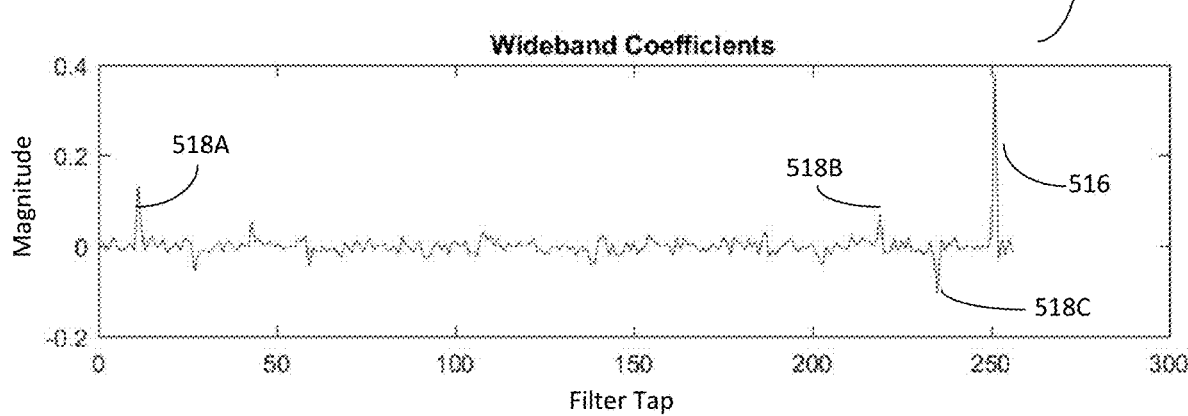

FIGS. 5A-5C show the performance of the subband adaptive filter system 200 in an acausal scenario where the target signal 216 is a five sample lead of the input signal 202. In this acausal scenario, the adaptive filter 206 has no lead information from the input signal 202 to predict the target signal 216. Therefore, one course of action for the adaptive filter 206 to minimize the error signal 214 is to keep the filter coefficients at zero, and thus not generate any output signal 210, e.g., not reduce the noise but also not add any more noise.

FIG. 5A is a graph 500 showing the time traces of the desired signal 502, the output signal 504, and the error signal 506. These time traces again correspond to the target signal 216, the generated output signal 210, and the error signal 214 of FIG. 2 respectively. As evident from FIG. 5A, in the acausal scenario, the subband adaptive filter system 200 is unable to reduce the error signal 506, which remains consistently high over time.

FIG. 5B is a graph 508 showing plots 512A-512I (512, in general) of the frequency domain magnitudes of outputs generated by the corresponding transform modules 222 for the individual frequency subbands. Upon being stacked in the frequency domain, the frequency domain magnitudes of the overall wideband filter are represented by the plot 514. The filter coefficients for the overall wideband filter is obtained by computing an inverse transform of the values corresponding to the plot 514. As mentioned previously, in the acausal scenario, the target performance of the subband adaptive filter system 200 is to have filter coefficients that are all near zero. However, as seen in the graph 508, the subband coefficients 512 (that are not used during the stacking operation) located at the edges of each frequency subband grew to significantly large values. If values of these coefficients grow beyond the range of numerical representation, the resulting error condition, such as overflow error, can render the process implemented by the subband adaptive filter system 200 unstable.

FIG. 5C is a graph 510 showing the filter coefficients of the wideband filter, as determined by the subband adaptive filter system 200 in the acausal scenario. As shown, the subband adaptive filter system 200 generates a large coefficient 516 five samples from the end of the adaptive filter 206, as well as several other relatively large coefficients 518A-518C. This differs from the target performance of the subband adaptive filter system 200 in which all of the filter coefficients are near zero. This performance issue is related to the convolution of the transfer function 204 through the subband analysis filters 218A-218C, producing a pre-ring effect of this filter operation, described in further detail herein.

Figure 6:
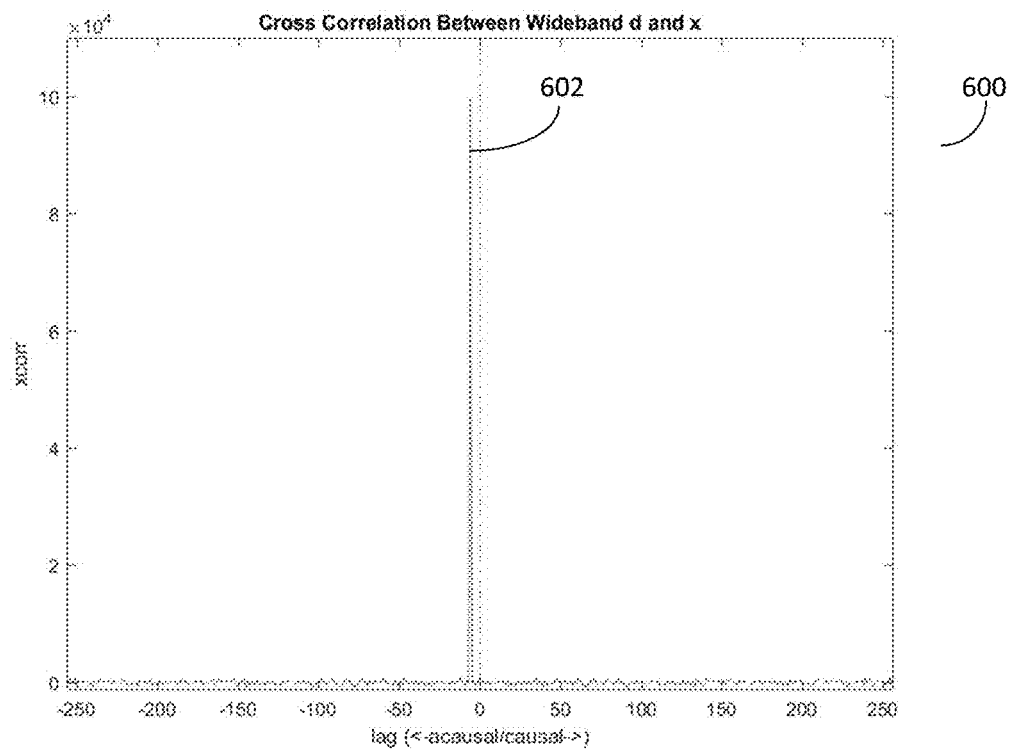
FIG. 6 is a graph showing the cross correlation of a target signal from the wideband adaptive filter system of FIG. 1 and an input signal that contributes to a plant model containing acausal information.
Figure 7:
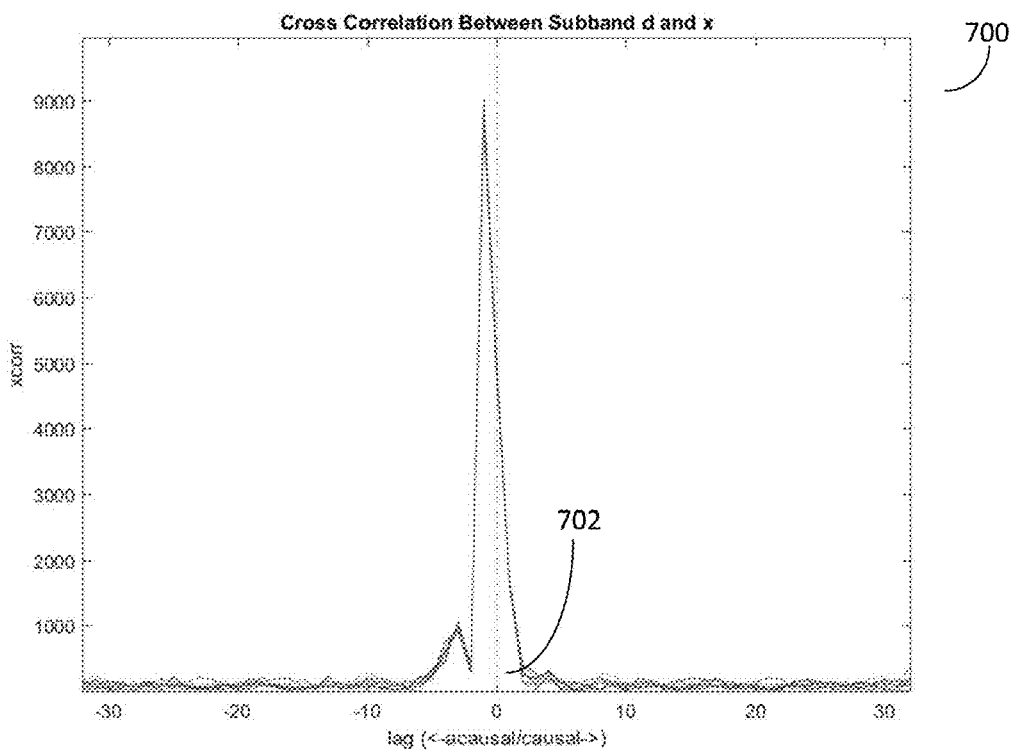
FIG. 7 is a graph showing the cross correlations of subband filtered error signals and corresponding subband filtered input signals from the subband adaptive filter system of FIG. 2 in an acausal scenario.

FIGS. 6-7 provide further insight into the performance issues of the subband adaptive filter system 200. FIG. 6 is a graph 600 showing the cross correlation of the target signal 116 from the wideband adaptive filter system 100 of FIG. 1 and the input signal 102 in the acausal scenario where the target signal 116 is a five sample lead of the input signal 102. The cross correlation shows a single peak 602 at a lag value of −5, which is outside of the causal range 0-255 that the filter could control. Thus, the adaptive filter 106 recognizes that it is operating in an acausal scenario, in which it cannot provide a suitable control to minimize the error signal 114.

Referring now to FIG. 7, a graph 700 shows the cross correlations of the subband filtered error signals 228 and the corresponding subband filtered input signals 227 from the subband adaptive filter system 200 of FIG. 2 where the target signal 216 is a five sample lead of the input signal 202. Unlike for the wideband adaptive filter system 100, for the subband adaptive filter system 200, the causal cross correlation values (lag 0) are not all zero. In other words, because of the bandlimited nature of the input 202 after being processed by the multiple analysis filters 218, the subband adaptive filter system 200 identifies some causal information 702 to act upon in order to reduce the error signal 214. This creates a discrepancy between what the subband adaptive filters 208 are trying to act upon and what the wideband filter 206 is actually capable of acting upon. Consequently, for the acausal scenario, the adaptation process in the subband adaptive filter system 200 essentially removes the feedback path that mitigates the chances of the subband adaptive filters 208 being rendered unstable. This removal of the feedback path occurs due to the presence of any acausal information in the signal path 204, but is most pronounced for coefficients near the causal/acausal boundary due to the impulse response of the subband analysis filters 218.

Figure 8:
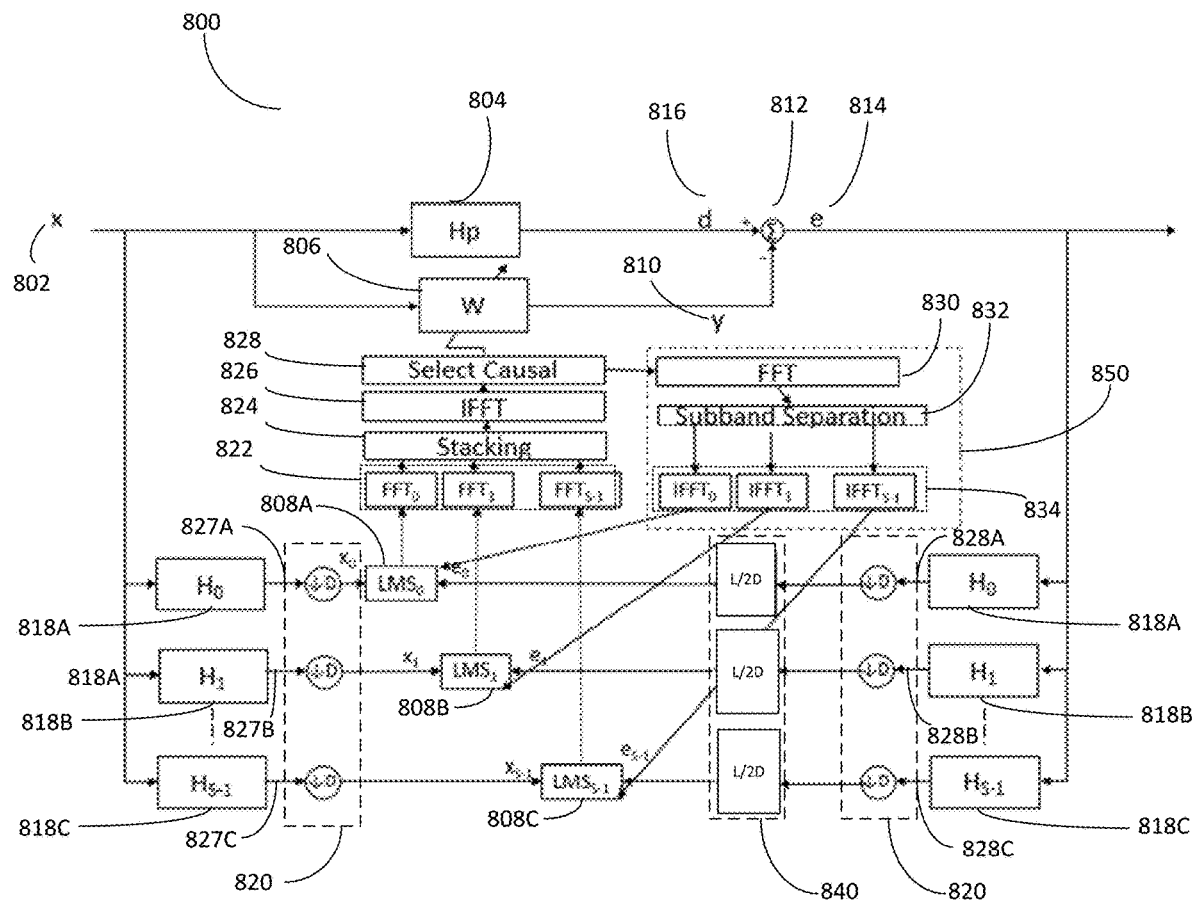
FIG. 8 is a block diagram showing an example subband adaptive filter system in accordance with technology described herein.

FIG. 8 shows a modified subband adaptive filter system 800 that includes an inverse stacking module 850 to resolve the significant growth of the subband filter coefficients demonstrated by the subband adaptive filter system 200 in the presence of acausal information, as described in relation to FIGS. 5A-5C. Specifically, in the subband adaptive filter system 800, information about the control capability of the wideband filter 806 is fed back to the subband adaptive modules 808A-808C (808 in general). Since causality is a time domain phenomenon, the adaptively computed coefficients of the wideband filter 806 are tracked and the coefficients corresponding to acausal information are set to zero (or to another low value that substantially limits the impact of the corresponding filter taps). Unlike the inverse transform module 226 of the subband adaptive filter system 200 of FIG. 2, the inverse transform module 826 of the subband adaptive filter system 800 computes coefficients that are not all necessarily used to adapt the wideband adaptive filter 806. Rather, a selection module 828 is configured to select only a subset of the output of the inverse transform module 826 to update the coefficients of the wideband adaptive filter 806. In some cases, the selection of coefficients is based on a correspondence of each coefficient to causal information. In some cases, the unselected coefficients are set to zero (or another low value that substantially limits the impact of the corresponding filter taps).

The subband adaptive filter system 800 further includes an inverse stacking module 850. The inverse stacking module 850 implements an inverse stacking process that includes multiple steps. First, the selected coefficients are transformed to a frequency domain representation, such as by an FFT. This can be done, for example, using another transform module 830. In some cases, alternative frequency domain transformation techniques may be implemented. The frequency domain representation of the coefficients is then separated into subbands corresponding to the subband adaptive modules 808, and the frequency domain representation for each subband is transformed into a corresponding time domain representation, in this example, using IFFT. This can be implemented, for example, using one or more inverse transform modules 834A-834C (834, in general). In some cases, alternative time domain transformation techniques may be implemented. The time domain coefficients are fed back to the subband adaptive modules 808 and used for the next iteration of updates to the wideband filter 806. In some implementations, the length of the subband adaptive modules 808 is expanded to include the effects of the subband analysis filters 818 (each having length L) as well as the coefficients needed for the desired control filter length. Since the resultant subband filtered input signals 827 and subband filtered error signals 828 are then downsampled at the downsampling module 820, this leads to an expansion of the subband adaptive modules 808 by approximately L/D. If the analysis filters 818 are assumed to be linear phase, then incorporating a delay 840 of L/(2D) on the downsampled error signals allows the adaptive filters 808 to respond to the pre- and post-ring effects of the analysis filter impulse response. In some cases, to avoid algebraic loops created by circular dependencies of the coefficients, the coefficients that are fed back to the subband adaptive modules 808 are delayed by one or more samples.

In some implementations, the subband adaptive filter system 800 can provide the following advantages. Compared to the subband adaptive filter system 200, the subband adaptive filter system 800 reduces the chances of unstable performance when disposed in conjunction with a plant model that includes acausal components without affecting the performance when disposed in conjunction with a plant model that does not include acausal components. Furthermore, the inverse stacking process implemented by the module 850 may improve convergence rates for low-energy regions of the subband adaptive modules 808 by using the information from higher energy adjacent subbands for these regions. For instance, referring to FIG. 4B, each subband magnitude decreases from 1 to 0 in regions that are not used in the stacking operation. This happens due to the roll-off of the subband adaptive modules 208, resulting in less energy for the adaptive filter 206. The reduced energy is compensated for in the adjacent subband; thus when one subband magnitude starts to fall from 1 to 0, the adjacent subband has just finished the rise to 1. In contrast, FIG. 9B does not demonstrate this characteristic because the inverse stacking process of the subband adaptive filter system 800 uses the estimate in the higher energy subbands to better predict the desired filter in the out-of-band regions of the adjacent subbands. In some cases, the selection module 828 can be configured to disable adaptation in frequency bands where the changes, and hence a need to adapt, is less than a threshold. For example, Road Noise Cancellation (RNC) is expected to operate in approximately the 30-300 Hz frequency range, and therefore sampling may occur at rates of around 600 Hz (i.e., at or over the corresponding Nyquist rate). While relatively lower sampling rates may be desirable to reduce computational load, higher sampling rates can reduce filter latency and improve overall performance in some cases, particularly when the input signal 802 and error signal 814 are physically close to each other. However, increasing the sampling rate also results in an expanded operational frequency range where control may not be possible. For example, increasing the sampling rate from 600 Hz to 2 kHz may improve the latency of the control signal up to 300 Hz but does not result in meaningful cancellation above 300 Hz. The wideband adaptive filter system 106 would incur the computational cost of controlling frequencies between 300 Hz and 1 kHz when increasing the sampling rate to 2 kHz with the primary benefit being the improved latency. Alternatively, using the subband adaptive filter system 800, subbands above 300 Hz can be disabled (e.g., by skipping the adaptation calculation) and thus the improved latency can be realized without calculating unnecessary regions of the control frequency range.

While the subband adaptive filter system 800 is shown as a Single Input Single Output (SISO) system, the concepts disclosed can be readily extended to a Multiple Input Multiple Output (MIMO) system. Similarly, although the subband adaptive filter system 800 is depicted with LMS subband adaptive modules 808, other subband adaptive modules, such as a FXLMS module, a FELMS module, or any combination of these modules, may be used.

Figure 9A:
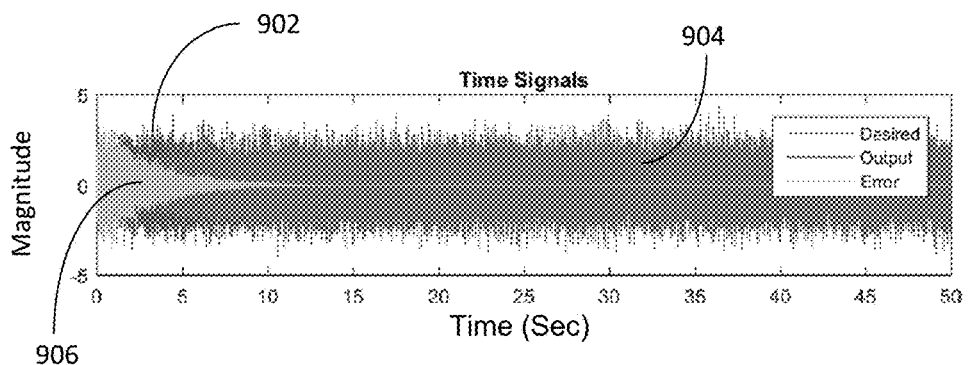
FIGS. 9A-9D are graphs showing the performance of the subband adaptive filter system of FIG. 8 when disposed in conjunction with a plant model that does not include acausal components.
Figure 9B:
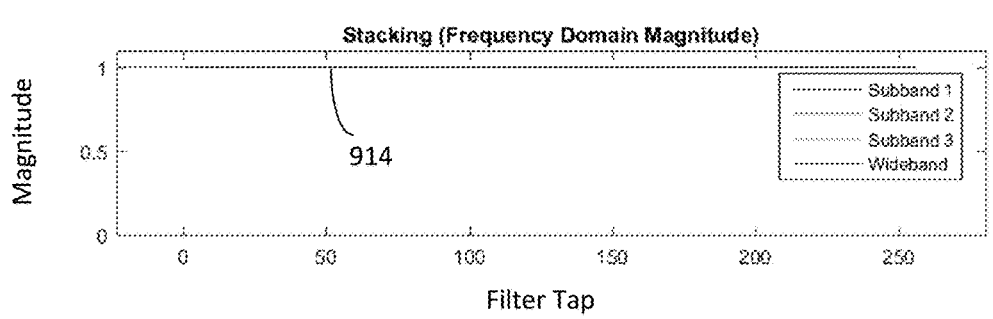
Figure 9C:
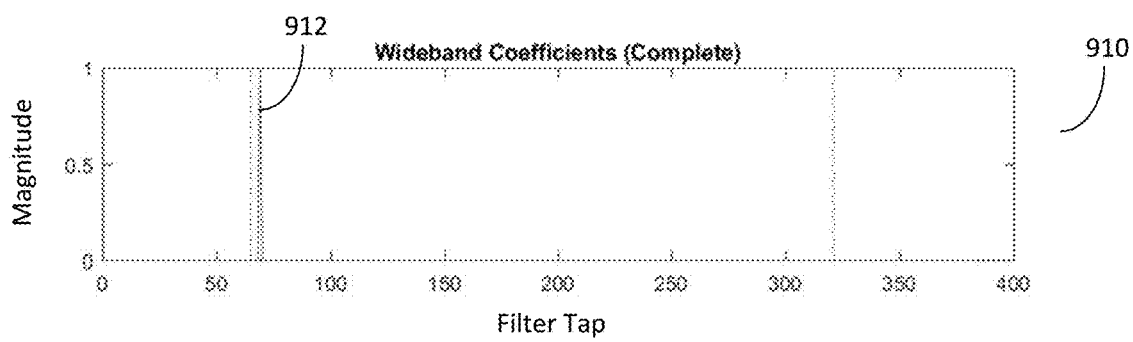
Figure 9D:
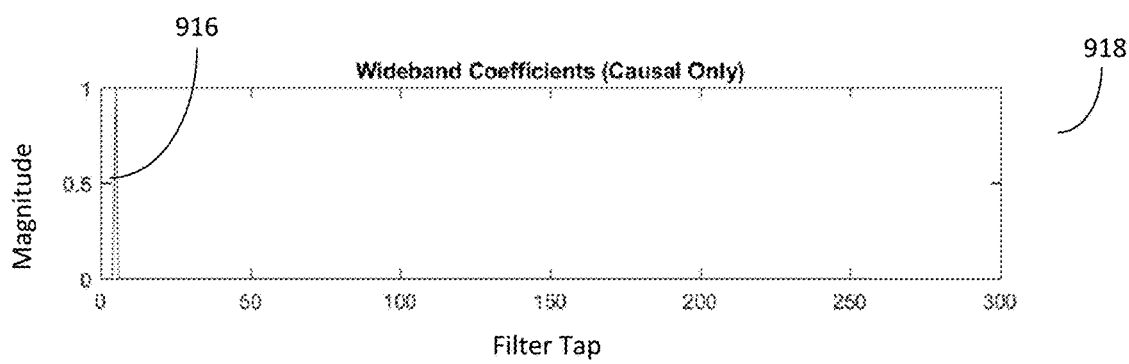

FIGS. 9A-9D show the performance of the subband adaptive filter system 800 in the causal scenario where the target signal 816 is a five-sample lag of the input signal 802. FIG. 9A is a graph 900 showing the time traces of the desired signal 902, the output signal 904, and the error signal 906. These time traces correspond to the target signal 816, the generated output signal 810, and the error signal 814 of FIG. 8 respectively. As evident from FIG. 9A, the subband adaptive filter system 800 was able to converge to a set of coefficients that generated an output signal 810 reasonably approximating the target signal 816. FIG. 9B is a graph 908 showing a plot 914 of the frequency domain magnitudes of the overall wideband filter, which is 1, as expected for the causal scenario. FIG. 9C is a graph 910 showing the complete set of coefficients in time domain representation determined by the subband adaptive filter system 800 after completion of the IFFT operation performed by the inverse transform module 826. As discussed above, the delay 840 on the error signal lengthens the subband adaptive modules 808A-808C, which explains why the coefficient 912 at the filter tap of interest has been moved to a later coefficient (e.g., after tap 5). FIG. 9D removes this effect by truncating the first and last L/(2D) coefficients from FIG. 9C, showing a time domain representation of only the wideband coefficients of the adaptive filter 806 corresponding to causal components in the plant model as output from the selection module 828. As expected, the filter tap of interest 916 moves to tap 5, matching the performance of the subband adaptive filter system 200 for the causal scenario.

Figure 10A:
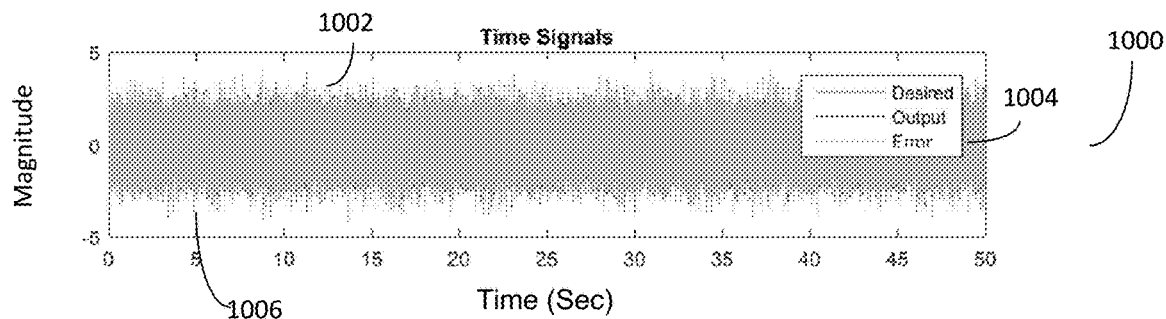
FIGS. 10A-10C are graphs showing the performance of the subband adaptive filter system of FIG. 8 when disposed in conjunction with a plant model that includes acausal components.
Figure 10B:
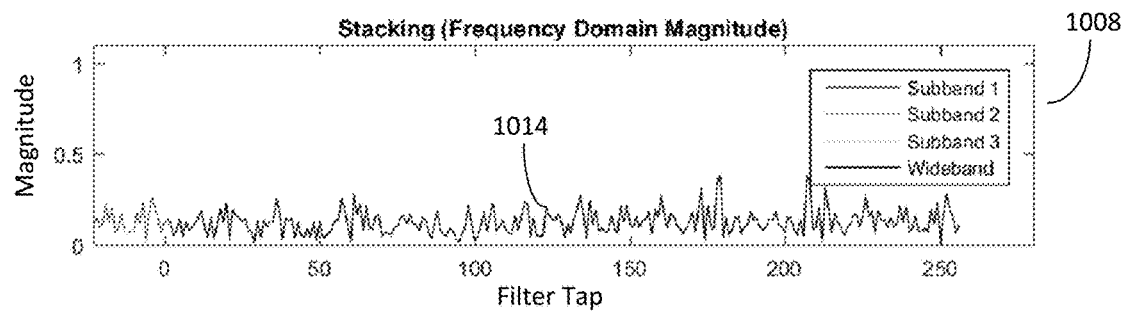
Figure 10C:
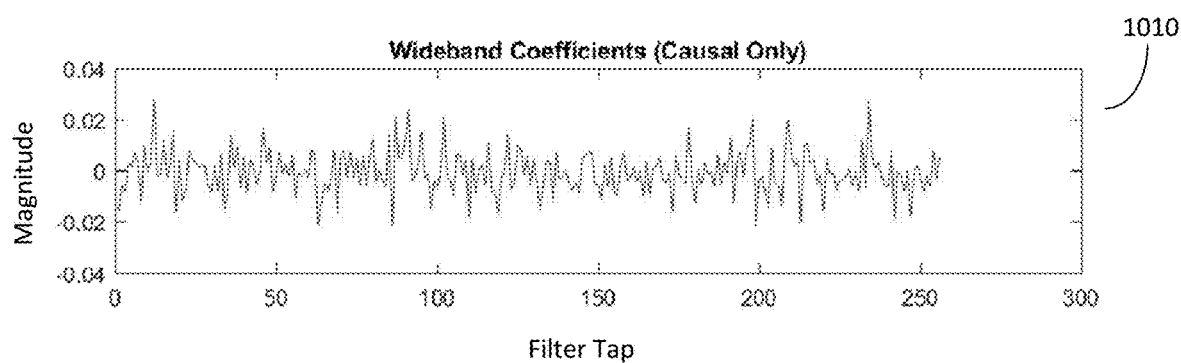

FIGS. 10A-10C show the performance of the subband adaptive filter system 800 in the acausal scenario where the target signal 816 is a five sample lead of the input signal 802. Again, in the acausal scenario, the adaptive filter 806 has no lead information from the input signal 802 to predict the target signal 816. Therefore, one course of action for the adaptive filter 806 to minimize the error signal 814 is to keep the filter coefficients at zero and thus not generate any output signal 810. As a result, target performance for the adaptive filter 806 in the acausal scenario would be to observe, with the exception of some low level noise, filter coefficients that are all near zero and an error signal 214 that essentially tracks the target signal 216.

FIG. 10A is a graph 1000 showing the time traces of the desired signal 1002, the output signal 1004, and the error signal 1006. These time traces correspond to the target signal 816, the generated output signal 810, and the error signal 814 of FIG. 8 respectively. As evident from FIG. 10A, in the acausal scenario, the subband adaptive filter system 800 is unable to reduce the error signal 804, which remains consistently high over time.

FIG. 10B is a graph 1008 showing a plot 1014 of the frequency domain magnitudes of the overall wideband filter. As mentioned previously, in the acausal scenario, one suitable course of action of the subband adaptive filter system 800 is to have filter coefficients that are all near zero. Here, all of the filter coefficients are near zero, having values between 0 and 0.5, demonstrating stable performance in the acausal scenario. In some cases, the magnitude of this coefficient "noise" can be reduced by reducing the adaptive step size. This is in contrast to the subband adaptive filter system 200, which in the acausal scenario, had subband coefficients that grew to significantly large values as described in relation to FIG. 5B.

This stable performance of the subband adaptive filter system 800 in the acausal scenario is further supported by FIG. 10C. FIG. 10C shows a time domain representation of only the wideband coefficients of the adaptive filter 806 corresponding to causal information in the input signal 802, for example, as output by the selection module 828. Again, the target performance of the subband adaptive filter system 800 in this scenario is for all of the filter coefficients to be near zero. As shown in the graph 1010, the coefficients are indeed close to zero, having values within the range of −0.04 to 0.04. This is in contrast to the subband adaptive filter system 200, which in the acausal scenario, had significantly large wideband coefficients at certain filter taps as described in relation to FIG. 5C.

Figure 11:
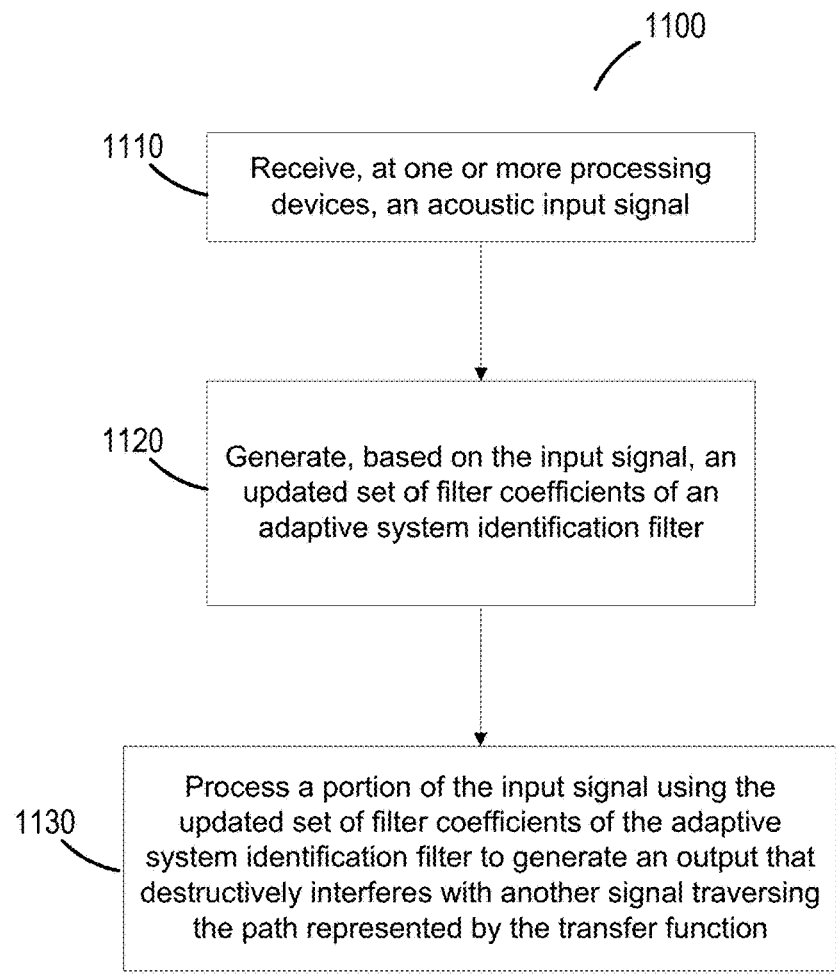
FIG. 11 is a flow chart of a method for estimating coefficients of an adaptive filter.

FIG. 11 shows a flowchart of an example process 1100 for estimating coefficients of an adaptive filter. In some implementations, the operations of the process 1100 can be performed by one or more of the devices described above with respect to FIG. 8 such as the subband adaptive filter system 800.

Operations of the process 1100 include receiving, at one or more processing devices, an input signal (1110). In some implementations the input signal can be an acoustic noise signal or other signal. For example, the input signal may correspond to the input signal 802 described above in relation to FIG. 8.

The operations also include generating, based on the input signal, an updated set of filter coefficients of an adaptive system identification filter (1120). The adaptive system identification filter can be configured to represent a transfer function of a path traversed by the input signal. For example, in some implementations, the transfer function of the path traversed by the input signal may correspond to the transfer function 804 shown in FIG. 8. In some implementations, the adaptive system identification may correspond to a wideband adaptive filter such as the adaptive filter 806 of the subband adaptive filter system 800.

Generating the updated set of filter coefficients of the adaptive system identification filter (1120) can include separating the acoustic input signal into multiple frequency subbands. For example, this can be achieved by the subband analysis filters 818A-C shown in FIG. 8.

Generating the updated set of filter coefficients of the adaptive system identification filter (1120) further includes determining, for each frequency subband, one or more coefficients of a corresponding subband adaptive module, and combining the one or more coefficients of multiple subband adaptive modules to generate the updated set of filter coefficients of the adaptive system identification filter. For example, determining one or more coefficients of a corresponding subband adaptive module can be achieved using an LMS, FXLMS, or FELMS style module. In some cases, combining the one or more coefficients of multiple subband adaptive modules can correspond to the stacking module 824 described above in relation to FIG. 8.

Determining the one or more coefficients of the corresponding subband adaptive modules further includes obtaining a precomputed set of filter coefficients of the adaptive system identification filter and selecting a subset of the precomputed set of filter coefficients of the adaptive system identification filter. In some implementations, the subset of the precomputed set of filter coefficients is selected to correspond to a causal relationship between the input signal and another signal traversing the path represented by the transfer function. For example, the another signal traversing the path represented by the transfer function may be a target signal such as the target signal 816. In some implementations, the subset of the precomputed set of filter coefficients is selected to correspond to frequency bands within a target performance range. For example, the target performance range may be between approximately 30-300 Hz for Road Noise Cancellation (RNC) applications.

Operations of the process 1100 also include processing a portion of the input signal using the updated set of filter coefficients of the adaptive system identification filter to generate an output that destructively interferes with another signal traversing the path represented by the transfer function (1130). For example, the generated output may correspond to the output signal 810 shown in FIG. 8. In some implementations, the output signal may correspond to a control signal for driving an acoustic transducer such as a speaker. In some implementations, the output signal may destructively interfere with another acoustic signal containing noise to improve the perceived quality of a user's acoustic experience.

The functionality described herein, or portions thereof, and its various modifications (hereinafter "the functions") can be implemented, at least in part, via a computer program product, e.g., a computer program tangibly embodied in an information carrier, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

Other embodiments not specifically described herein are also within the scope of the following claims. Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A method comprising:
   receiving, at one or more processing devices, an input signal;
   receiving, at the one or more processing devices, a feedback signal;

generating, based on the input signal and the feedback signal, an updated set of filter coefficients of an adaptive filter, wherein generating the updated set of filter coefficients of the adaptive filter comprises:

determining, for each of multiple frequency subbands of the input signal, one or more coefficients of a corresponding subband adaptive filter, and combining one or more coefficients of multiple subband adaptive filters to generate the updated set of filter coefficients of the adaptive filter, wherein determining the one or more coefficients of the corresponding subband adaptive filter comprises:

(a) obtaining a precomputed set of filter coefficients of the adaptive filter, and (b) selecting a subset of the precomputed set of filter coefficients of the adaptive filter, wherein a number of coefficients in the subset is less than a number of the precomputed set of filter coefficients of the adaptive filter, and wherein selecting the subset of the precomputed set of filter coefficients of the adaptive filter comprises selecting the subset based on a correspondence of the subset to a causal relationship between the input signal and another signal traversing a path represented by a transfer function of the adaptive filter; and processing a portion of the input signal using the updated set of filter coefficients of the adaptive filter to generate an output that destructively interferes with the another signal traversing the path represented by the transfer function.

2. The method of claim 1, wherein the causal relationship between the input signal and the another signal traversing the path represented by the transfer function is determined by a cross-correlation of the input signal and the another signal.

3. The method of claim 1, wherein the subset of the precomputed set of filter coefficients of the adaptive filter is selected to correspond to frequency bands within a target performance range.

4. The method of claim 3, wherein the target performance range is between approximately 30-300 Hz.

5. The method of claim 1, wherein the input signal is collected by one or more accelerometers or one or more microphones.

6. The method of claim 1, wherein one or more of the corresponding subband adaptive filters is a least mean squares (LMS) module, a Filtered-X least mean squares (FXLMS) module, and/or a filtered error least mean squares (FELMS) module.

7. The method of claim 1, wherein combining the one or more coefficients of the multiple subband adaptive filters comprises transforming time domain representations of the one or more coefficients of the multiple subband adaptive filters into corresponding frequency domain representations, combining the corresponding frequency domain representations of the one or more coefficients of the multiple subband adaptive filters, and transforming the combined frequency domain representations into a time domain representation representing a combination of the one or more coefficients of the multiple subband adaptive filters.

8. The method of claim 1, wherein determining the one or more coefficients of the corresponding subband adaptive filter further comprises computing, based on the subset, frequency domain representations of the precomputed set of filter coefficients of the adaptive filter, separating the frequency domain representations into the multiple frequency subbands and computing a corresponding time domain representation for each, and generating the one or more coefficients of the corresponding subband adaptive filter based on the corresponding time domain representation.

9. The method of claim 1, wherein the precomputed set of filter coefficients that are not selected are adjusted to be substantially near zero.

10. A noise reduction system comprising:

one or more feedforward sensors configured to generate an input signal;

one or more feedback sensors configured to generate a feedback signal;

an adaptive filter;

one or more processing devices, configured to
  receive the input signal and the feedback signal;
  generate, based on the input signal and the feedback signal, an updated set of filter coefficients of the adaptive filter, wherein generating the updated set of filter coefficients of the adaptive filter comprises:
    determining, for each of multiple frequency subbands of the input signal, one or more coefficients of a corresponding subband adaptive filter, and
    combining one or more coefficients of multiple subband adaptive filters to generate the updated set of filter coefficients of the adaptive filter,
    wherein determining the one or more coefficients of the corresponding subband adaptive filter comprises:
      (a) obtaining a precomputed set of filter coefficients of the adaptive filter, and
      (b) selecting a subset of the precomputed set of filter coefficients of the adaptive filter, wherein a number of coefficients in the subset is less than a number of the precomputed set of filter coefficients of the adaptive filter, and wherein selecting the subset of the precomputed set of filter coefficients of the adaptive filter comprises selecting the subset based on a correspondence of the subset to a causal relationship between the input signal and another signal traversing a path represented by a transfer function; and
  process a portion of the input signal using the updated set of filter coefficients of the adaptive filter to generate an output that destructively interferes with the another signal traversing the path represented by the transfer function; and one or more transducers, driven by the output generated by the one or more processing devices.

11. The system of claim 10, wherein the causal relationship between the input signal and the another signal traversing the path represented by the transfer function is determined by a cross-correlation of the input signal and the another signal.

12. The system of claim 10, wherein the subset of the precomputed set of filter coefficients of the adaptive filter is selected to correspond to frequency bands within a target performance range.

13. The system of claim 10, wherein the target performance range is between approximately 30-300 Hz.

14. The system of claim 10, wherein one or more of the corresponding subband adaptive filters is a least mean squares (LMS) module, a Filtered-X least mean squares (FXLMS) module, and/or a filtered error least mean squares (FELMS) module.

15. The system of claim 10, wherein combining the one or more coefficients of the multiple subband adaptive filters comprises transforming time domain representations of the one or more coefficients of the multiple subband adaptive filters into corresponding frequency domain representations, combining the corresponding frequency domain representations of the one or more coefficients of the multiple subband adaptive filters, and transforming the combined frequency domain representations into a time domain representation representing a combination of the one or more coefficients of the multiple subband adaptive filters.

16. The system of claim 10, wherein determining the one or more coefficients of the corresponding subband adaptive filter further comprises computing, based on the subset, frequency domain representations of the precomputed set of filter coefficients of the adaptive filter, separating the frequency domain representations into the multiple frequency subbands and computing a corresponding time domain representation for each, and generating the one or more coefficients of the corresponding subband adaptive filter based on the corresponding time domain representation.

17. The system of claim 10, wherein the precomputed set of filter coefficients that are not selected are adjusted to be substantially near zero.

18. One or more non-transitory computer readable media storing instructions that are executable by one or more processing devices, and upon such execution cause the one or more processing devices to perform operations comprising:

receiving an input signal;

receiving a feedback signal;

generating, based on the input signal and the feedback signal, an updated set of filter coefficients of an adaptive filter, wherein generating the updated set of filter coefficients of the adaptive filter comprises:

determining, for each of multiple frequency subbands of the input signal, one or more coefficients of a corresponding subband adaptive filter, and combining one or more coefficients of multiple subband adaptive filters to generate the updated set of filter coefficients of the adaptive filter, wherein determining the one or more coefficients of the corresponding subband adaptive filter comprises:

(a) obtaining a precomputed set of filter coefficients of the adaptive filter, and (b) selecting a subset of the precomputed set of filter coefficients of the adaptive filter, wherein a number of coefficients in the subset is less than a number of the precomputed set of filter coefficients of the adaptive filter, and wherein selecting the subset of the precomputed set of filter coefficients of the adaptive filter comprises selecting the subset based on a correspondence of the subset to a causal relationship between the input signal and another signal traversing a path represented by a transfer function; and processing a portion of the input signal using the updated set of filter coefficients of the adaptive filter to generate an output that destructively interferes with the another signal traversing the path represented by the transfer function.

* * * * *